(12) United States Patent
Kho (10) Patent No.: US 9,752,703 B2
(45) Date of Patent: Sep. 5, 2017

(54) METHODS AND APPARATUS TO REDUCE SHOCK IN A SLIT VALVE DOOR (71) Applicant: Applied Materials, Inc., Santa Clara, CA (US)

(72) Inventor: Jeffrey A. Kho, Union City, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 166 days.

(21) Appl. No.: 14/682,780

(22) Filed: Apr. 9, 2015

(65) Prior Publication Data

US 2015/0345660 A1 Dec. 3, 2015

Related U.S. Application Data (60) Provisional application No. 62/004,328, filed on May 29, 2014.

(51) Int. Cl.

| F16K 25/00 | (2006.01) |
|---|---|
| F16K 3/00 | (2006.01) |
| F16K 47/00 | (2006.01) |
| F16K 51/02 | (2006.01) |
| F16K 3/18 | (2006.01) |
| H01L 21/67 | (2006.01) |

(52) U.S. Cl.
CPC ............. *F16K 47/00* (2013.01); *F16K 3/18* (2013.01); *F16K 51/02* (2013.01); *H01L 21/67126* (2013.01)

(58) Field of Classification Search
CPC . F16K 1/26; F16K 3/02; F16K 3/0218; F16K 3/10; F16K 3/14; F16K 3/16; F16K 3/18; F16K 3/182; F16K 3/184; F16K 3/186; F16K 3/188; F16K 39/04; F16K 39/045; F16K 5/14; F16K 51/02
USPC ....... 251/193, 195, 196, 197, 198, 199, 200, 251/202, 326–329, 333, 334, 170, 251/356–358, 167, 171, 332
See application file for complete search history.

(56) References Cited

U.S. PATENT DOCUMENTS

| 6,089,543 A * | 7/2000 | Freerks ............. H01L 21/67126 251/356 |
| 7,413,162 B2 * | 8/2008 | Geiser ....................... F16K 3/10 251/175 |
| 7,469,715 B2 | 12/2008 | Lee et al. |

(Continued)

FOREIGN PATENT DOCUMENTS

GB 1263391 A * 2/1972 ............... F16K 3/16

*Primary Examiner* — Mary McManmon
*Assistant Examiner* — Hailey K Do
(74) *Attorney, Agent, or Firm* — Patterson + Sheridan LLP (57) ABSTRACT Embodiments disclosed herein generally relate to apparatus and methods for sealing a vacuum chamber with a slit valve assembly that in one embodiment includes a housing having side walls and at least one substrate transfer port formed therein, the housing having an interior volume defined by the side walls, a slit valve door disposed within the housing and positionable between an open position clear of the substrate transfer port and a closed position sealing the substrate transfer port, and a bumper assembly disposed on an edge of at least one face of the slit valve door, the bumper assembly comprising a first bumper member made of a first material and a second bumper made of a second material that is different than the first material.

13 Claims, 10 Drawing Sheets

(56) References Cited

U.S. PATENT DOCUMENTS

| | | | | |
|---|---|---|---|---|
| 7,654,505 B2* | 2/2010 | Schoen | ............... | F16K 3/10 251/175 |
| 8,327,878 B2* | 12/2012 | Lee | ............... | F16K 3/0227 137/554 |
| 8,641,014 B2* | 2/2014 | White | ............... | F16K 3/188 251/175 |
| 8,888,106 B2* | 11/2014 | Hamade | ............... | F16J 15/104 277/626 |
| 8,991,785 B2* | 3/2015 | Sico | ............... | F16K 3/06 251/284 |
| 9,383,036 B2* | 7/2016 | Kamibayashiyama | | F16K 3/0227 |
| 2009/0045371 A1* | 2/2009 | Kamibayashiyama | | F16K 3/0227 251/328 |
| 2012/0247564 A1 | 10/2012 | Kho | | |

* cited by examiner

METHODS AND APPARATUS TO REDUCE SHOCK IN A SLIT VALVE DOOR

CROSS-REFERENCE TO RELATED APPLICATION

This application claims benefit of U.S. Provisional Patent Application Ser. No. 62/004,328, filed May 29, 2014, which is hereby incorporated by reference herein.

BACKGROUND

Field

Embodiments disclosed herein generally relate to a slit valve door and a method for sealing a chamber with a slit valve door.

Description of the Related Art

In semiconductor, flat panel display, photovoltaic/solar panel, and other substrate processing systems, it is common to arrange vacuum chambers (i.e., load lock chambers, transfer chambers, process chambers) in a cluster, in-line, or a combination of cluster/in-line arrangements in order to process substrates. These systems may process substrates in single or batch substrate fashion. During processing, substrates may be transferred to and from chambers in which vacuum must be maintained or established. To allow access to the inside of the chamber, and to enable vacuum operation, a substrate transfer port formed through the chamber wall in the shape of a slit is frequently provided to accommodate the substrate being processed. The substrate transfer port is opened and closed (e.g., sealed) by a slit valve assembly.

The slit valve assembly includes a slit valve door that may be movably actuated to open or close the substrate transfer port. When the slit valve door is clear of the substrate transfer port, one or more substrates may be transferred between two vacuum chambers through the substrate transfer port. When the slit valve port is closed and sealed by the slit valve door, substrates may not be transferred in or out of vacuum chambers through the substrate transfer port and the vacuum chambers remain sealed. For example, two vacuum chambers connected by a slit valve assembly may include a process or transfer chamber which requires periodic isolation from a load lock chamber in order to maintain vacuum in the process or transfer chamber when the load lock chamber is vented.

Generally, the operational speed of the slit valve door is important to the throughput of substrate processing system. However, faster door operations result in large shocks or vibrations as the slit valve door opens and closes. The shocks may loosen and disperse particles within the vacuum chambers, which may create defects on the substrate. This may be particularly important in the processing of organic light emitting diode (OLED) substrates as well as thin film encapsulation (TFE) processes where contamination should be kept at a minimum. Additionally, large shocks over time may loosen fasteners and increase wear on the components of the slit valve door and the slit valve assembly.

Therefore, there is a need for a slit valve assembly capable of sealing chambers with reduced shock.

SUMMARY

Embodiments disclosed herein generally relate to apparatus and methods for sealing a vacuum chamber with a slit valve assembly. In one embodiment, the slit valve assembly includes a housing having side walls and at least one substrate transfer port formed therein, the housing having an interior volume defined by the side walls, a slit valve door disposed within the housing and positionable between an open position clear of the substrate transfer port and a closed position sealing the substrate transfer port, and a bumper assembly disposed on an edge of at least one face of the slit valve door, the bumper assembly comprising a first bumper member made of a first material and a second bumper made of a second material that is different than the first material.

In another embodiment, the slit valve assembly includes a housing having side walls and at least one substrate transfer port formed therein, the housing having an interior volume defined by the side walls, a slit valve door disposed within the housing and positionable between an open position clear of the substrate transfer port and a closed position sealing the substrate transfer port, an actuator coupled to the slit valve door and operable to move the slit valve door between the open and closed positions, and a bumper assembly disposed on parallel edges of at least one face of the slit valve door, the bumper assembly comprising a first bumper member made of a first material and a second bumper made of a second material that is different than the first material.

In another embodiment, the slit valve assembly includes a housing having side walls and at least one substrate transfer port formed therein, the housing having an interior volume defined by the side walls, a slit valve door disposed within the housing and positionable between an open position clear of the substrate transfer port and a closed position sealing the substrate transfer port, and a plurality of first bumper members and a plurality of second bumper members disposed on an edge of at least one face of the slit valve door along a longitudinal axis of the slit valve door.

BRIEF DESCRIPTION OF THE DRAWINGS

So that the manner in which the above recited features of the present disclosure can be understood in detail, a more particular description, briefly summarized above, may be had by reference to embodiments, some of which are illustrated in the appended drawings. It is to be noted, however, that the appended drawings illustrate only typical embodiments and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments disclosed herein generally relate to apparatus and methods for sealing one or more vacuum chambers with a slit valve assembly. The slit valve assembly utilizes flexible or soft components to prevent jolting or shaking of the vacuum chamber thereby preventing shock that produce undesired particles and/or process contamination. Embodiments will be described below in regards to a slit valve assembly and chambers available from AKT America, Inc., a subsidiary of Applied Materials, Inc., Santa Clara, Calif. However, it is to be understood that the embodiments may have utility using other slit valve assemblies and other chambers, including those sold by other manufacturers.

Figure 1:
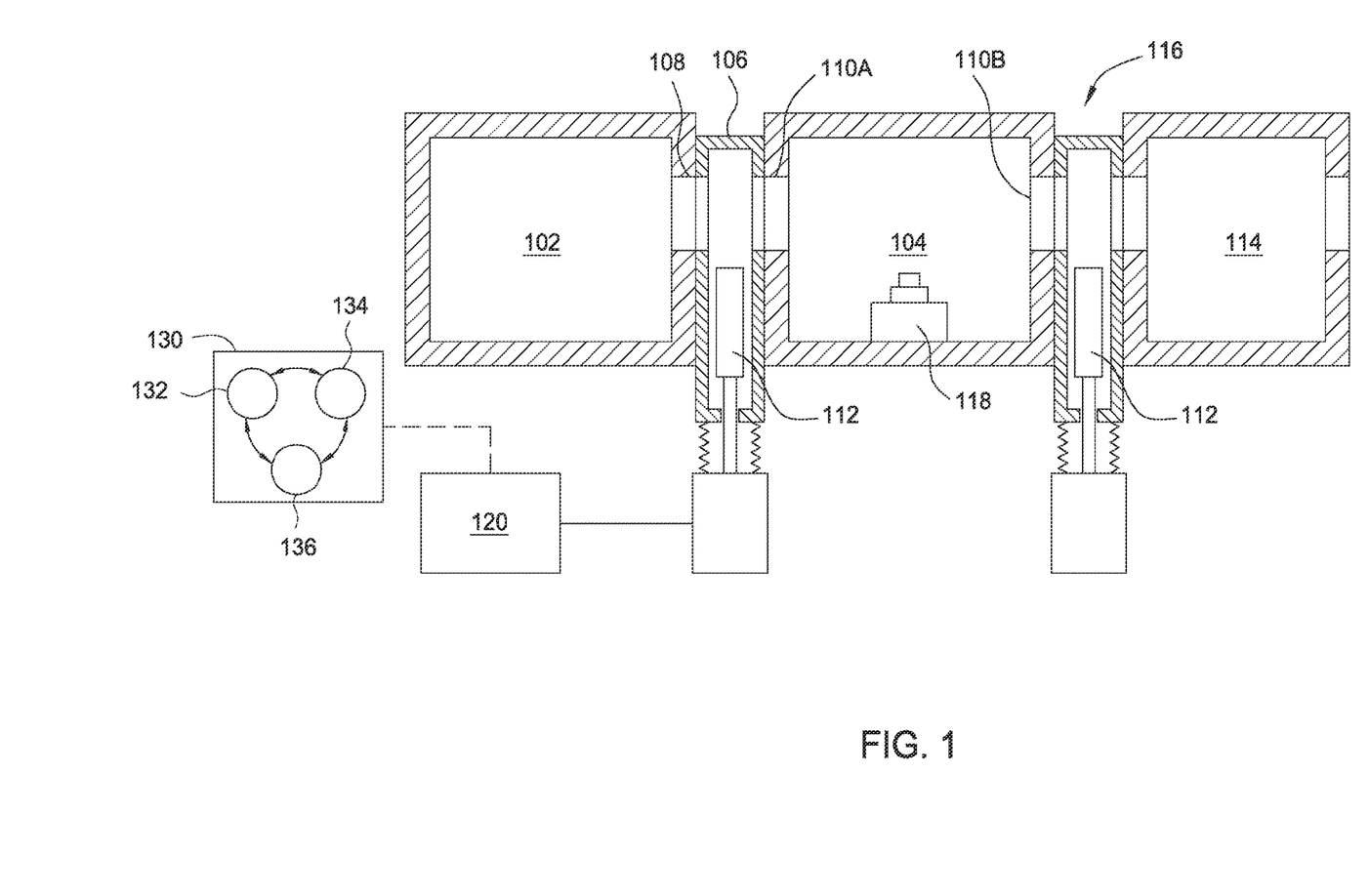
FIG. 1 is a schematic sectional view of two chambers connected by a slit valve assembly.

FIG. 1 is a schematic sectional view of two vacuum chambers 102, 104 coupled by a slit valve assembly 106. The vacuum chambers 102, 104 include substrate transfer ports 108, 110A formed therein that permit a substrate to enter and exit the respective chamber 102, 104. The slit valve assembly 106 is operable to seal at least one of the vacuum chambers 102, 104 so that the vacuum chambers 102, 104 are environmentally isolated from each other. The slit valve assembly 106 includes a door 112 that may be moved between a first position to seal at least one of the substrate transfer ports 108, 110A, and a second position that allows substrates to pass between the vacuum chambers 102, 104 through the substrate transfer ports 108, 110A.

In one embodiment, the vacuum chamber 102 comprises a processing chamber for performing a process on a substrate, and the vacuum chamber 104 comprises a transfer chamber. The vacuum chamber 104, when operating as a transfer chamber, transfers substrates to and from a load lock chamber system 114 through a transfer port 110B and to and from the vacuum chamber 102, when used as a process chamber. A second slit valve assembly 116 may be disposed between the load lock chamber system 114 and the vacuum chamber 104. Additionally, the vacuum chamber 104 may include a robot 118 for transferring substrates between the transfer ports 110A and 110B. While the second slit valve assembly 116 may be similar in construction and operation to the slit valve assembly 106, the description herein is limited to the operation and construction of the slit valve assembly 106.

The vacuum chamber 102, when operating as a processing chamber, may be configured to perform a thermal process on a substrate in a low pressure environment. In one embodiment, the slit valve assembly 106 may be operable to seal the vacuum chamber 102 to contain the low pressure therein during processing. The thermal processes that may be performed by the vacuum chamber 102 include deposition, etching, annealing, implanting, as well as other thermal processes in the formation of electronic devices on the substrate. Accordingly, the vacuum chamber 104 may not need to be sealed by the slit valve assembly 106 when the vacuum chamber 102 is effectively sealed by the slit valve assembly 106.

In one embodiment, a flow control circuit 120 is coupled to the various components of the slit valve assembly 106 to facilitate operation of the slit valve door 112. The flow control circuit 120 is further described in detail below with regards to FIG. 7. Additionally, a controller 130, including a central processing unit (CPU) 136, a memory 132, and support circuits 134 for the CPU 136, is coupled to the flow control circuit 120 and to various components of the slit valve assembly 106 to facilitate control of the slit valve door 112. To facilitate control of the valve assembly and control circuit as described above, the CPU 136 may be one of any form of general purpose computer processor that can be used in an industrial setting. The memory 132 is coupled to the CPU 136. The memory 132, or computer-readable medium, may be one or more of readily available memory such as random access memory (RAM), read only memory (ROM), floppy disk, hard disk, or any other form of digital storage, local or remote. The support circuits 134 are coupled to the CPU 136 for supporting the processor in a conventional manner. These circuits include cache, power supplies, clock circuits, input/output circuitry and subsystems, and the like. A method for controlling the operation of the door, such as described herein, is generally stored in the memory 132 as a software routine. The software routine may also be stored and/or executed by a second CPU (not shown) that is remotely located from the hardware being controlled by the CPU 136.

Figure 2A:
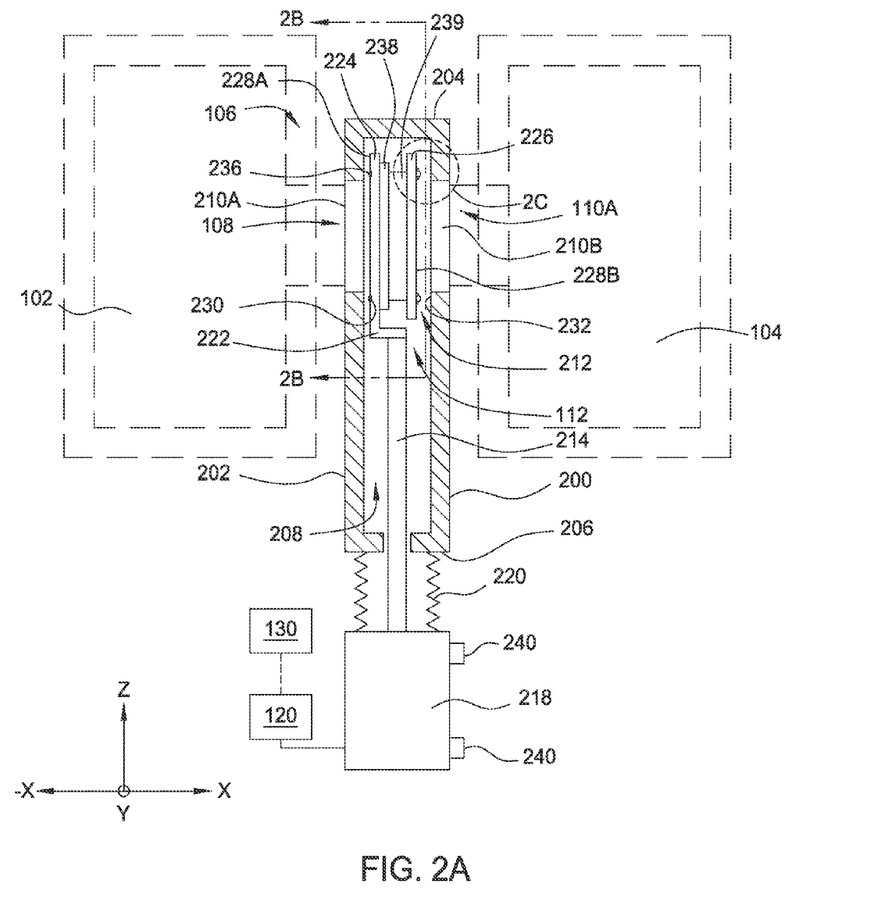
FIG. 2A is a side cross-sectional view of one embodiment of a slit valve assembly.

FIG. 2A is a side cross-sectional view of one embodiment of a slit valve assembly 106. The slit valve assembly 106 generally includes a housing 200 having a top 204, a bottom 206, and side walls 202 that define an interior volume 208 within the housing 200. Opposing passages 210A, 210B are formed through the side walls 202 to substantially align with the substrate transfer ports 108, 110A, respectively. The passages 210A, 210B are generally sized to permit substrates to pass therethrough to and from the vacuum chamber 102 and the vacuum chamber 104.

The slit valve assembly 106 further includes a slit valve door 112 disposed within the interior volume 208 of the housing 200. The slit valve door 112 includes a first plate 224 and a second plate 226 coupled to a base 222 in an opposing relation. The first and second plates 224, 226 are coupled to a plate actuator 238, which is configured to urge the first and second plates 224, 226 towards the side walls 202. One or both of the first and second plates 224, 226 may be coupled to a seal assembly 239, which may be a bellows device, that at least partially houses the plate actuator 238. Each of the first and second plates 224, 226, have a face 228A, 228B, respectively. Each of the faces 228A, 228B is configured to be in proximity to inner contact surfaces 230, 232 of the side walls 202 when the plate actuator 238 urges the first and second plates 224, 226 towards the side walls 202 in a closing operation of the slit valve assembly 106.

As discussed above, when the vacuum chamber 102 is operating as a processing chamber, the slit valve assembly 106 may be operable to seal the vacuum chamber 102 to contain the low pressure therein during processing. Therefore, a seal is provided between contact surface 230 and the face 228A when the slit valve door 112 is in a closed position. To fully seal the first plate 224 against the side walls 202, the first plate 224 includes an o-ring 236 which is pressed against the contact surface 230 in the closing operation. The o-ring 236 provides a fluid tight seal between the face 228A of the first plate 224 and the contact surface 230 of the side walls 202.

In some embodiments, it may not be necessary for the vacuum chamber 104 to be sealed by the slit valve assembly 106. For example, after a substrate transfer process from the vacuum chamber 104 to the vacuum chamber 102, the pressure is substantially equalized in the vacuum chamber 102, the vacuum chamber 104 and the interior volume 208 of the slit valve assembly 106. However, when the slit valve door 112 is closed and a seal is provided between the face 228A of the first plate 224 and the contact surface 230 of the side walls 202, the vacuum chamber 102 is effectively sealed. At this time the vacuum chamber 102 may be pumped down to a pressure lower than that of the interior volume 208 and the vacuum chamber 104. If there is no pumping of the vacuum chamber 104, the pressure within the vacuum chamber 104 may be shared with the interior volume 208 of the slit valve assembly 106. Thus, while contact between the face 228B of the second plate 226 and the contact surface 232 of the side walls 202 may be provided during a closing operation of the slit valve assembly 106, a fluid tight seal may not be necessary for operation. Therefore, the second plate 226 includes a bumper assembly 212 which is urged against the contact surface 232 in the closing operation.

Figure 2B:
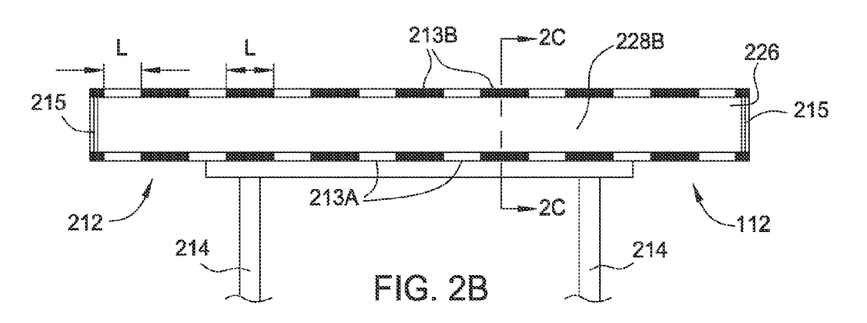
FIG. 2B is an elevation view of the slit valve door of FIG. 2A.

FIG. 2B is an elevation view of the slit valve door 112 of FIG. 2A showing one embodiment of the bumper assembly 212. The bumper assembly 212 includes a plurality of contact members, such as a first bumper member 213A and a second bumper member 213B disposed on major sides (i.e., parallel edges) of the face 228B of the slit valve door 112. One or more grooves 215 may be formed in or on the minor sides of the face 228A of the slit valve door 112. The grooves 215 may be shaped to interface with a surface of the housing 200 (shown in FIG. 2A), such as on minor sides of the passage 210B not shown in the cross-sectional view of FIG. 2A.

Each of the first bumper members 213A and the second bumper members 213B may comprise members extending from a surface of the face 228B of the second plate 226 for contacting the contact surface 232 of the side walls 202 (shown in FIG. 2A). Each of the first bumper members 213A and the second bumper members 213B may comprise a material that is different or include different material properties. In one embodiment, the bumper assembly 212 comprises a bi-material bumper assembly having two bumper members with different properties. For example, each of the second bumper members 213B may be more compressible than each of the first bumper members 213A.

In one embodiment, each of the first bumper members 213A may comprise a durable, resilient, heat resistant elastomeric material, such as a fluoropolymeric material, such as polytetrafluoroethylene (FIFE), for example a RULON® material, or polyetheretherketone (PEEK). In one embodiment, each of the second bumper members 213B may comprise a material that is softer or more compressible than the first bumper members 213A. Each of the second bumper members 213B may comprise durable, resilient, heat resistant material, such as a rubber or elastomeric material, i.e., a fluoroelastomer material, for example a VITON® material, or other FKM elastomers (as defined in ASTM D1418). In one embodiment, the first bumper members 213A comprise a first material having a property that is greater than a second property of a second material of the second bumper members 213B. The property may be hardness or compressibility. In one embodiment, the hardness of the first material of the first bumper members 213A is about 60 Shore D (on the Shore D hardness scale) and the hardness of the second material of the second bumper members 213B is about 75 Shore A (on the Shore A hardness scale) to about 90 Shore A.

One or both of the first bumper members 213A and the second bumper members 213B may comprise a conductive material that contacts the contact surface 232 of the side walls 202 (shown in FIG. 2A) to form an electrical connection therebetween. For example, when the face 228B of the second plate 226 is made of a conductive metal, and the side walls 202 of the housing 200 (shown in FIG. 2A) is made of a conductive metallic material, at least one of the first bumper members 213A and the second bumper members 213B may have a conductive property to provide an electrical connection (e.g., a ground connection). Thus, if radio frequency (RF) is applied in the vacuum chamber 102 during a process, the slit valve door 112 is grounded.

If electrical properties are desired in one or both of the first bumper members 213A and the second bumper members 213B, an elastomeric material having conductive fillers may be utilized. In one embodiment, each of the first bumper members 213A may comprise a plastic or a polymeric material, such as a perfluoroether material, for example perfluoroalkoxy alkane (PFA). Conductive fillers include metallic particles, conductive fibers, or fibers coated with a conductive material. Conductive material includes metallic materials that are heat resistant, such as nickel, stainless steel, gold, silver, among others. Other conductive fillers include carbon powder, carbon fibers, carbon nanotubes, carbon nanofoam, carbon aerogels, and combinations thereof, that may be coated with a conductive material and interspersed into the polymeric material. In one embodiment, each of the first bumper members 213A may comprise PFA with carbon fibers coated with a metallic material, such as nickel. Thus, the first bumper members 213A may be conductive to form an electrical connection between the face 228B of the second plate 226 and the contact surface 232 of the side walls 202 (shown in FIG. 2A) in the closed position.

In one embodiment, each of the first bumper members 213A may alternate with the second bumper members 213B across the face 228B of the slit valve door 112. The first bumper members 213A may be laterally positioned proximate to the second bumper members 213B across the face 228B in the alternating configuration. Each of the first bumper members 213A and the second bumper members 213B may include a length L and the length L of each of the first bumper members 213A and second bumper members 213B may be substantially the same, in one embodiment. In other embodiments, the length L of the first bumper members 213A may be different than the length L of the second bumper members 213B. In one embodiment, the length L of each of the first bumper members 213A are greater than the length L of an adjacent second bumper members 213B.

The length L and/or number of second bumper members 213B may be chosen based on a desired surface area of second bumper members 213B relative to a surface area of the first bumper members 213A. In one embodiment, the ratio of second bumper members 213B to first bumper members 213A is about 8:5. As explained in more detail below, the ratio, number, length and/or positioning of the second bumper members 213B may determined based on a desired reduction of shock during closing operations of the slit valve assembly 106.

Figure 2C:
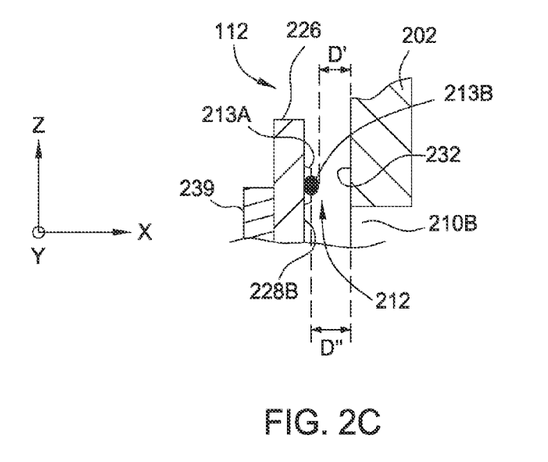
FIG. 2C is an enlarged partial cross-section of the second plate and the side wall of FIG. 2A.

FIG. 2C is an enlarged partial cross-section of the second plate 226 and the side wall 202 of FIG. 2A. As shown in the cross-section, the first bumper members 213A and the second bumper members 213B are positioned to project away from the face 228B of the second plate 226. Additionally, the second bumper members 213B project (i.e., extend) a greater distance from the face 228B of the second plate 226 as compared to a projected distance of the first bumper members 213A. The graded projection distance of the first bumper members 213A and the second bumper members 213B allows the second bumper members 213B to contact the contact surface 232 of the side wall 202 prior to contact between the first bumper members 213A and the contact surface 232. Thus, in a closing operation of the slit valve assembly 106, the second bumper members 213B contact the side wall 202 before the first bumper members 213A.

When the material of the second bumper members 213B is softer and more compliant than the material of the first bumper members 213A, the second bumper members 213B absorb most of the initial impact in the closing operation. Further, the first bumper members 213A and the second bumper members 213B are substantially aligned along a longitudinal axis of the slit valve door 112. However, the first bumper members 213A substantially align in a first plane that is different than a second plane of the first bumper members 213A based on the differing projected distance. Thus, in one embodiment, each of the second bumper members 213B are utilized as a shock absorber while the first bumper members 213A, although somewhat compressible, may function as a "hard stop" for the slit valve door 112 to prevent metal to metal contact in the closing operation. The second bumper members 213B may be compressed in the closing operation to at or near the extension distance of the first bumper members 213A to allow at least partial contact between one or more of the first bumper members 213A and the contact surface 232. However, initial shock in the closing operation is absorbed by the second bumper members 213B thereby greatly reducing the shock in the slit valve assembly 106 during the closing operation.

In some embodiments, distances between the contact surface 232 of the side wall 202 and one or both of the first bumper members 213A and the second bumper members 213B may be set to further decrease shock in the slit valve assembly 106. In one embodiment, a first distance D' and a second distance D", both originating from the contact surface 232, represent a bumper to contact surface gap for the slit valve door 112 in the open position. The first distance D' shows a distance between the contact surface 232 and the second bumper members 213B. The first distance D' provides a gap allowing movement of the slit valve door 112 vertically (Z direction) within the housing 200 (shown in FIG. 2A) without contact between the second bumper members 213B and the side wall 202. The second distance D" shows a distance between the contact surface 232 and the first bumper members 213A, which is greater than the first distance D'. The first distance D' and the second distance D" may be minimal to decrease a travel distance of the slit valve door 112 laterally (X direction), particularly during a closing operation of the slit valve assembly 106, while also minimizing contact between the first bumper members 213A and the second bumper members 213B with the side wall 202. The minimal distance thus minimizes shock by limiting inertial forces in the slit valve door 112 during lateral movement in the closing operation. In one embodiment, the first distance D' may be about 1.5 millimeters (mm) to about 0.9 mm, such as about 1.1 mm, or greater. In one embodiment, the second distance D" may be about 3.6 mm to about 2.8 mm, such as about 3.2 mm, or greater.

Figure 3:
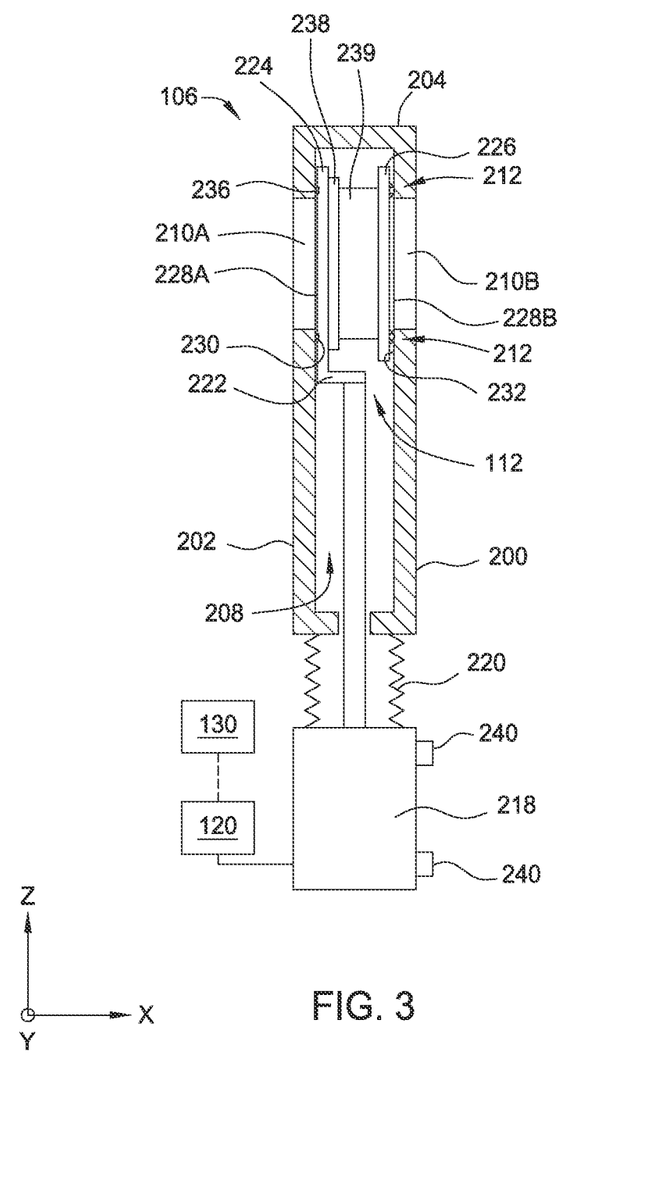
FIGS. 3 and 4 are side cross-sectional views of the slit valve assembly showing the slit valve door in different positions.
Figure 4:
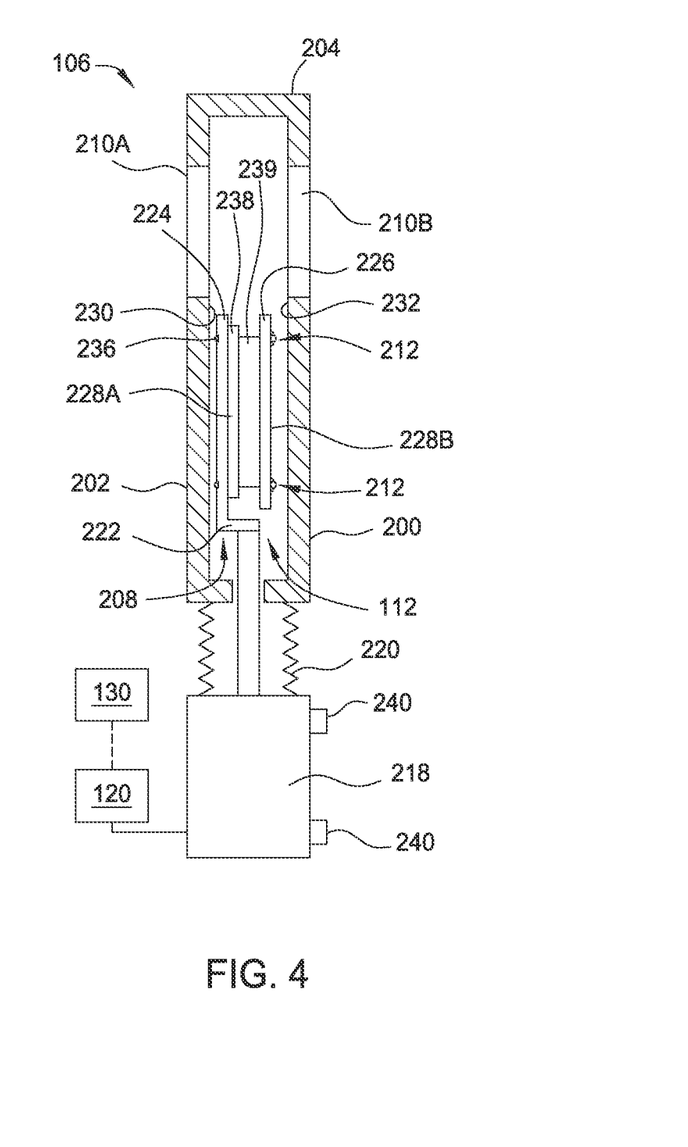

Construction and operational parameters of the slit valve assembly 106 are more specifically explained in FIGS. 2A, 3 and 4, which are side cross-sectional views of the slit valve assembly 106 showing the slit valve door 112 in different positions. The slit valve door 112 is coupled to a door actuator 218 by a rod 214 extending through a hole 216 formed through the bottom 206 of the housing 200. The door actuator 218 may be an air cylinder or a pneumatic cylinder. In one embodiment, the door actuator 218 is a vertically-oriented, double-acting air cylinder. A seal 220, such as a bellows device, may be disposed around the hole 216 to form a seal between the bottom 206 of the housing 200 and the door actuator 218 thereby providing a sealed interior volume 208 of the housing 200.

The door actuator 218 is configured to move the slit valve door 112 to move between raised position, as shown in FIG. 2A and FIG. 3, and a lowered position, as shown in FIG. 4, within the interior volume 208 of the housing 200. In the raised position, as seen in FIGS. 2A and 3, the slit valve door 112 is arranged within the interior volume 208 such that the first and second plates 224, 226 are aligned with the passages 210A, 210B, respectively. In the lowered position, as seen in FIG. 4, the slit valve door 112 is disposed proximate the bottom of the interior volume 208 of the housing 200 with the first and second plates 224, 226 clear of the passages 210A, 210B, such that a substrate may pass through the slit valve assembly 106 through the passages 210A, 210B. As shown in FIG. 3, the slit valve door 112 is also configured to seal the passages 210A, 210B when in the raised position by urging the first and second plates 224, 226 against the side walls 202 using the plate actuator 238. The plate actuator 238 may be configured to expand and contract laterally (X direction) to move the first and second plates 224, 226 relative to each other in a controlled fashion.

The slit valve assembly 106 further includes sensors 240 coupled to the controller 130. The sensors 240 may be configured to determine the position of the slit valve door 112 within the interior volume 208 and provide the position information to the controller 130. In one embodiment, the sensors 240 may include flag sensors coupled to the slit valve assembly 106 at locations near the end stroke positions of the door actuator 218.

Generally, the flow control circuit 120 and controller 130 may use readings from the sensors 240 to determine when the acceleration and deceleration rate and speed of the slit valve door 112 should change so that the slit valve door 112 may rapidly and smoothly move between raised and lowered positions with reduced jolts and shocks. The controller 130 may further control the expansion of the slit valve door 112 (i.e., the plate actuator 238) such that the first and second plates 224, 226 smoothly contact the side walls 202 with reduced jolts and shocks.

Figure 5A:
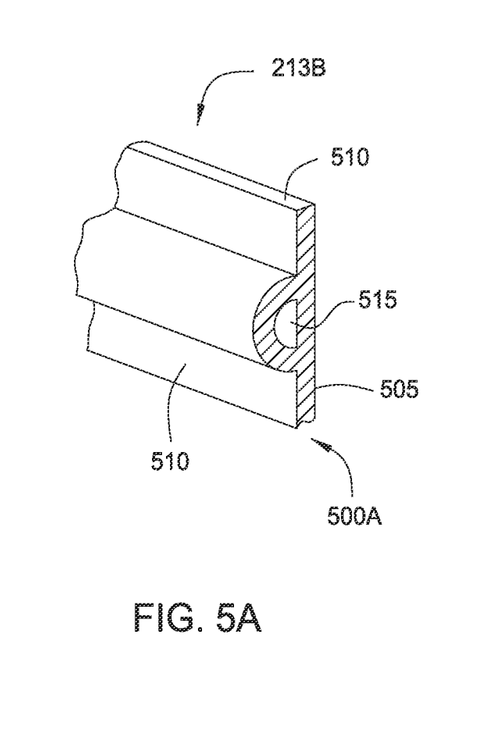
FIGS. 5A-5C are partial schematic isometric views of embodiments of the second bumper members that may be used with the slit valve assembly of FIG. 2A.
Figure 5B:
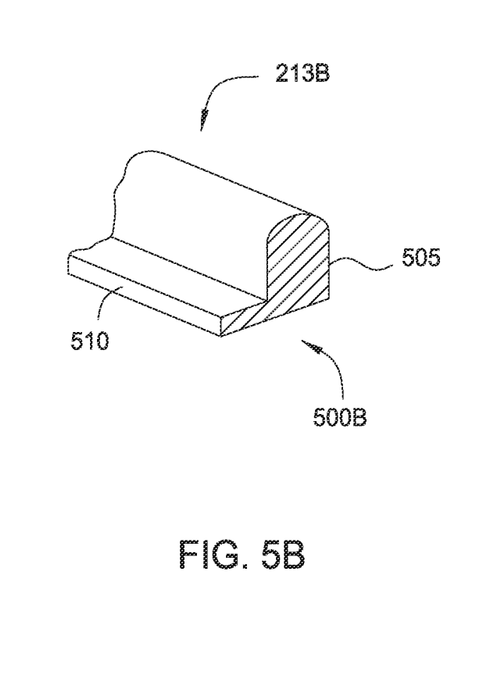
Figure 5C:
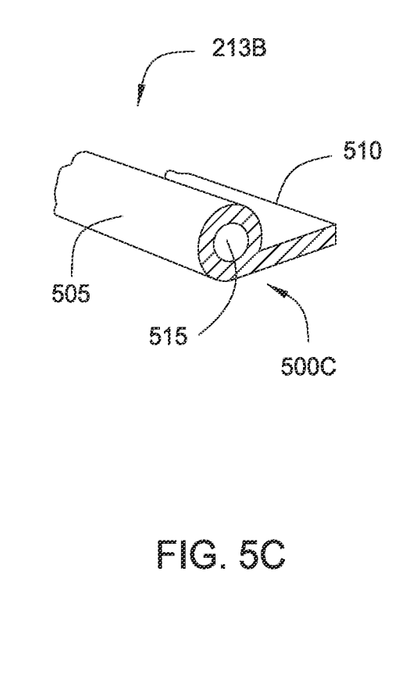

FIGS. 5A-5C are partial schematic isometric views of embodiments of the second bumper members 213B that may be used with the slit valve assembly 106. FIG. 5A shows an I-strip 500A, and FIGS. 5B and 5C show P-strips, one being a solid P-strip 500B and the other being a hollow P-strip 500C. Each of the I-strip 500A and the P-strips 500B and 500C include a body 505 made of a compressible elastomeric material as disclosed herein. Each of the I-strip 500A and the P-strips 500B and 500C also include at least one mounting portion 510 for coupling to the face 228B of the second plate 226. The mounting portion 510 may be the same material as the body 505, or the mounting portion 510 may be made of a harder material than the material of the body 505. In some embodiments, the body 505 may have an opening 515. The opening 515 may further increase the elastic properties of the body 505 thereby increasing shock absorbing properties of the second bumper members 213B.

Figures 6A, 6B:
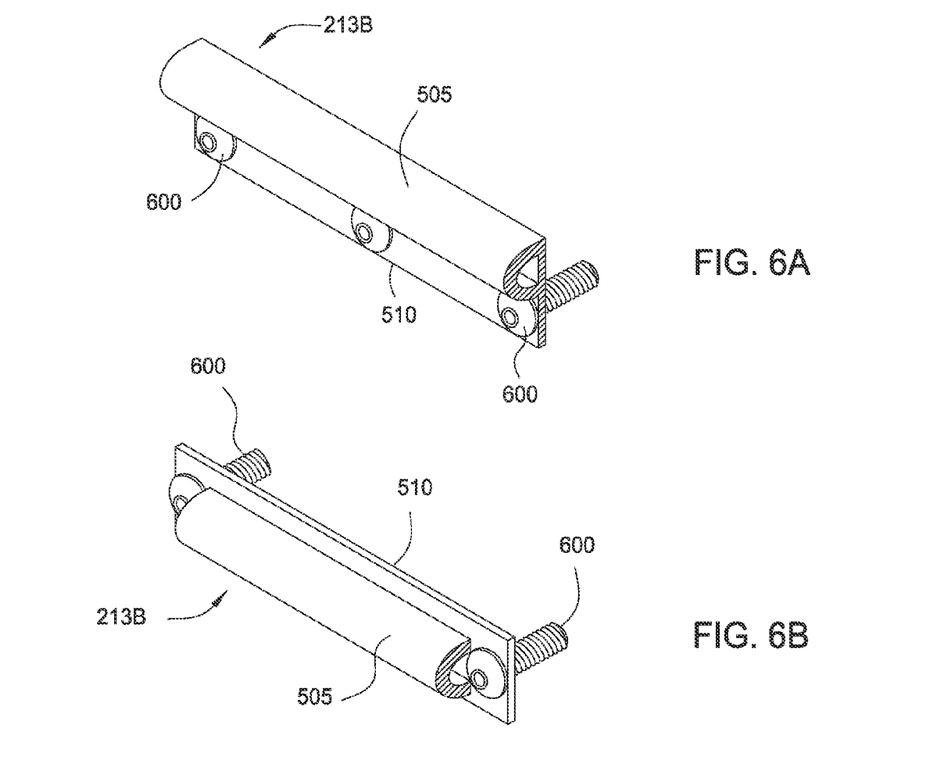
FIGS. 6A-6C are isometric views of embodiments of the showing various mounting configurations for the second bumper members.
Figure 6C:
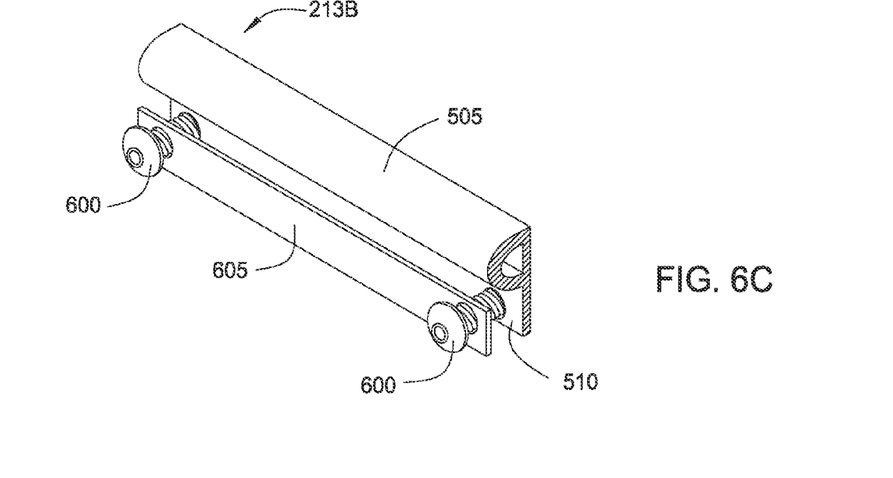

FIGS. 6A-6C are isometric views of embodiments of the second bumper members 213B showing various mounting configurations for coupling the second bumper members 213B to the face 228B of the second plate 226. One or more fasteners 600 may be disposed through the mounting portion 510 for coupling to the face 228B of the second plate 226. In some embodiments, the fasteners 600 may be coupled directly to the mounting portion 510 of the second bumper members 213B. In other embodiments, a mounting plate 605, made a harder more durable material than the body 505 and/or the material of the mounting portion 510, may be used.

Figure 7:
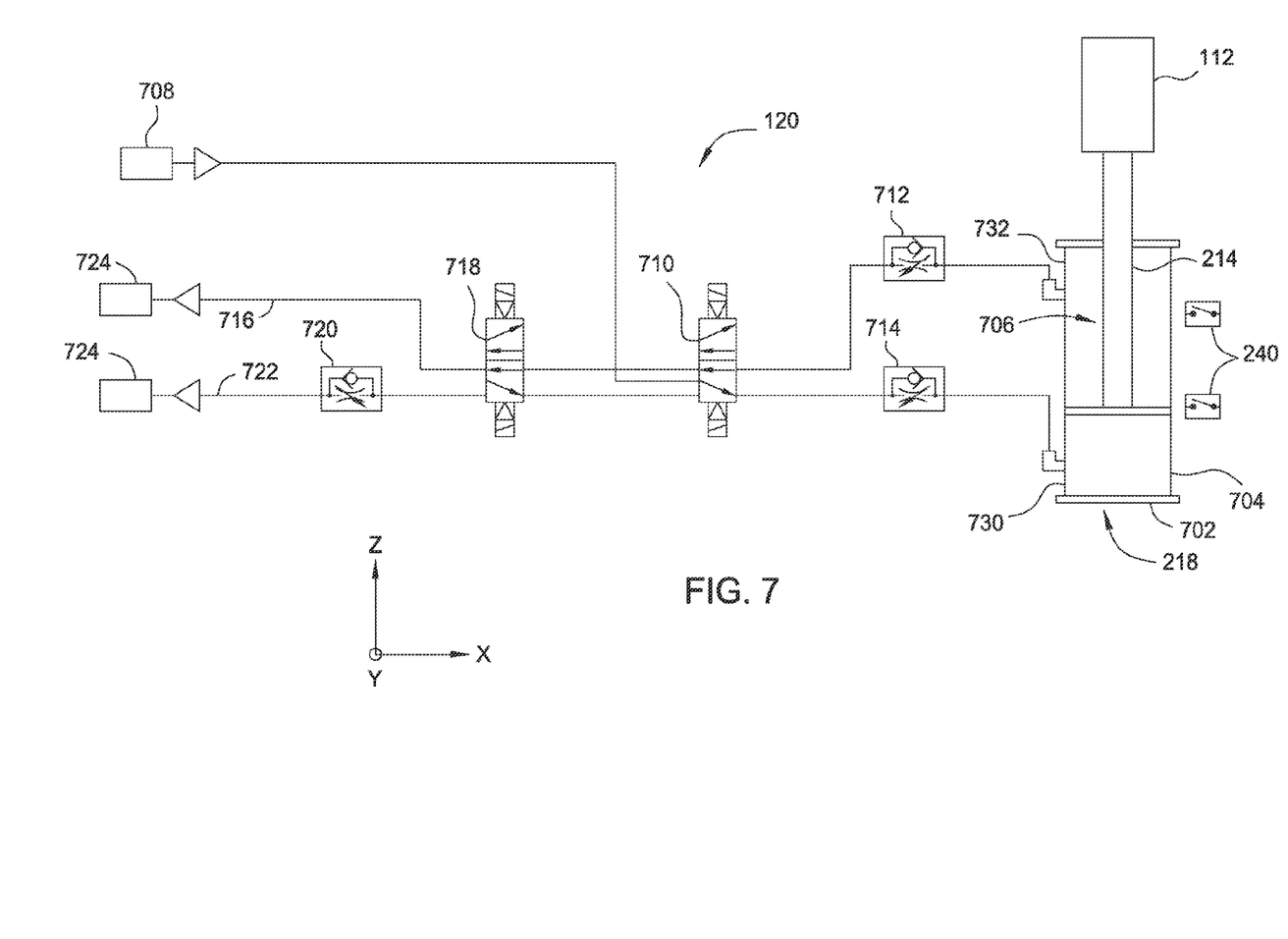
FIG. 7 is a schematic diagram of one embodiment of a flow control circuit that may be used to operate the slit valve assembly of FIGS. 2A, 3 and 4.

FIG. 7 is a schematic diagram of one embodiment of a flow control circuit 120 coupled to a door actuator 218 to selectively raise and lower the slit valve door 112 of FIGS. 2A, 3 and 4. As shown in FIG. 7, the door actuator 218 is double acting, vertical air cylinder 702 having a piston 704 disposed within an interior volume 706 of the air cylinder and is coupled to the slit valve door 112 by a rod 214. Sensors 240 are located at end positions of the air cylinder 702 to detect when the piston 704 moves proximate to the ends of the stroke positions of the door actuator 218.

A supply of clean, dry air (CDA) 708 is fluidly coupled to the air cylinder 702 by an air supply valve 710, a first flow control valve 712, and a second flow control valve 714 to selectively provide air to the air cylinder 702. In the embodiment shown, the air supply valve 710 includes a first state that selectively couples the CDA supply 708 to a top end 730 of the air cylinder and selectively couples a bottom end 732 of the air cylinder to vent exhaust. In one embodiment, the air supply valve 710 also includes a second state that selectively couples the CDA supply 708 to the bottom end 732 of the air cylinder and selectively couples the top end 730 of the air cylinder to vent exhaust.

The air supply valve 710 may be a diverter valve, a spool valve, a directional control valve, pneumatic valve or a solenoid valve of other suitable valve. The first flow control valve 712 may control the flow rate of air into the top end 730 of the air cylinder 702 while providing a full flow rate out of the top end 730. Similarly, the second flow control valve 714 may control the flow rate of air into the bottom end 732 of the air cylinder 702 while providing a full flow rate out of the bottom end 732 of the air cylinder. Providing air to the bottom end causes the rod 214 to extend (raising the rod 214 and slit valve door 112 (in the Z direction)) while providing air to the top and causes the rod 214 to retract (lowering the rod 214 and slit valve door 112 (in the Z direction)). Controlling the conductance of the exhaust of the air cylinder 702 controls the acceleration and deceleration of the rod 214, and hence, controlling the shock level caused by movement of the slit valve door 112.

The flow control circuit 120 further includes a high conductance exhaust line 716 and a low conductance exhaust line 722 fluidly coupled to the air cylinder 702 by a conductance switch 718 to permit air within the interior volume 706 of the air cylinder 702 to vent out to exhaust 724. The conductance switch 718 selectively couples the high conductance line 716 or the low conductance line 722 to the air cylinder 702 to change the flow rate of exhaust from the air cylinder 702. In one embodiment, the conductance switch 718 may be a diverter valve, a spool valve, a directional control valve, pneumatic valve, a solenoid valve or other suitable valve. The flow control circuit 120 optionally includes a third flow control valve 720 disposed in the low conductance exhaust line 722. The third flow control valve 720 may control the flow rate through the low conductance exhaust line 722 to exhaust to further reduce the rate of exhaust from the air cylinder 702. The conductance of the high conductance exhaust line 716 is greater than the conductance of the low conductance exhaust line 722, and for example, is at least 80% greater. In one embodiment, the high conductance exhaust line 716 has a flow rate of greater than about 650 liters per minute (L/min) to about 700 L/min. In one embodiment, the low conductance exhaust line 722 has a flow rate of less than about 75 L/min.

The flow control circuit 120 may be used to control operation of the slit valve assembly 106 such that the slit valve door 112 is moved vertically in short period of time in a controlled fashion to reduce shock. The flow control circuit 120 may accelerate, decelerate and/or smoothly stop and start movement of the slit valve door 112 to minimize shock during opening and closing operations of the slit valve assembly 106.

Using the flow control circuit 120 may enable the slit valve door 112 to smoothly reach the raised position at a decelerated speed such that the slit valve door 112 does not cause a substantial shock or jolt to the slit valve assembly 106. In one embodiment, the flow control circuit 120 reduces shock exerted on the slit valve assembly 106 by about 90 percent as compared to conventional single line vented systems. In another embodiment, the slit valve door 112 is decelerated by the flow control circuit 120 such that the slit valve door 112 coming to a stop in the raised position exerts a g-force (g) of no more than about 0.3 g's on the slit valve assembly 106. In one embodiment, the total time in which the slit valve door 112 takes to move 142 mm from the lowered position to the raised position is about 0.9 seconds. In another embodiment, the slit valve door 112 is decelerated by the flow control circuit 120 such that the slit valve door 112 coming to a stop in the lowered position exerts a force of no more than about 0.4 g's on the slit valve assembly 106. In one embodiment, the total time in which the slit valve door 112 takes to move 142 mm from the raised position to the lowered position is about 0.8 seconds.

After reaching the raised position, the slit valve door 112 may be operated to close the passages 210A, 210B (shown in FIG. 2A). The first and second plates 224, 226 of the slit valve door 112 expand towards the side walls 202 using a gas, such as CDA. The gas may be introduced into the plate actuator 238 (shown in FIG. 2A) by a second flow control circuit (not shown) to move the first and second plates 224, 226 apart (i.e., towards the contact surface 232 of the side wall 202 (shown in FIG. 2A)). Although not shown, the second flow circuit may be configured to be identical to the flow control circuit 120, in one embodiment.

Referring to FIG. 2A, the first plate 224 and the second plate 226 are moved relatively away from each other (in the X direction) for a distance just prior to initial contact between the o-rings 236 and the contact surface 230 of the housing 200, and just prior to initial contact between the second bumper members 213B and the contact surface 232 of the housing 200. Movement of the first plate 224 and the second plate 226 may then be decelerated enabling a controlled contact between the o-rings 236 and the contact surface 230 of the housing 200, and between the second bumper members 213B and the contact surface 232 of the housing 200. In one embodiment, the controller 130 may control the flow rate of gas entering the plate actuator 238 to control the rate of expansion of the slit valve door 112 (i.e., lateral movement of the first plate 224 and the second plate 226). A reduced flow rate provided by the controller controls the speed at which the first plate 224 and the second plate 226 move apart, and thus controls contact between the o-rings 236 and the contact surface 230 of the housing 200, and between the second bumper members 213B and the contact surface 232 of the housing 200. For example, when the first plate 224 and the second plate 226 are adjacent the contact surfaces 230, 232, respectively, the flow rate of gas may be reduced to slow movement of the first plate 224 and the second plate 226 such that the o-rings 236 smoothly compress against the contact surface 230, and the bumper assembly 212, particularly the second bumper members 213B, smoothly compress against the contact surface 232.

Figure 8:
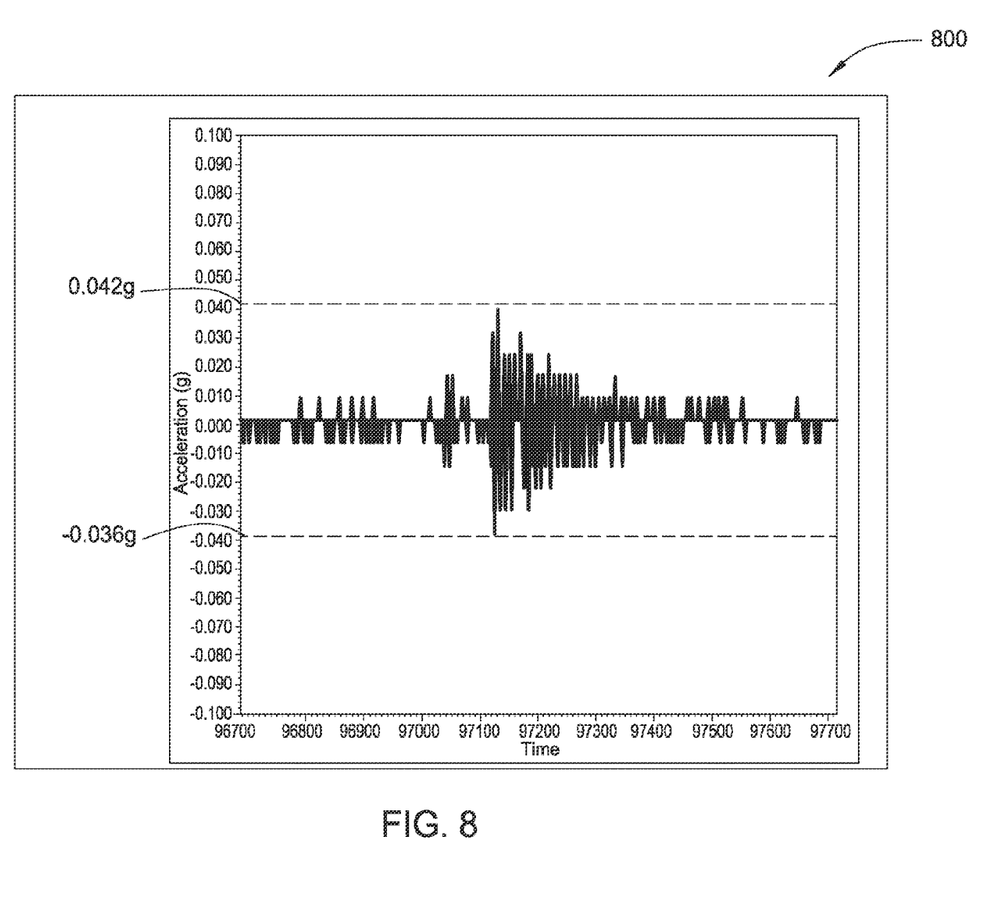
FIGS. 8 and 9 are graphs showing force values over time during operation of the slit valve assembly as described herein.
Figure 9:
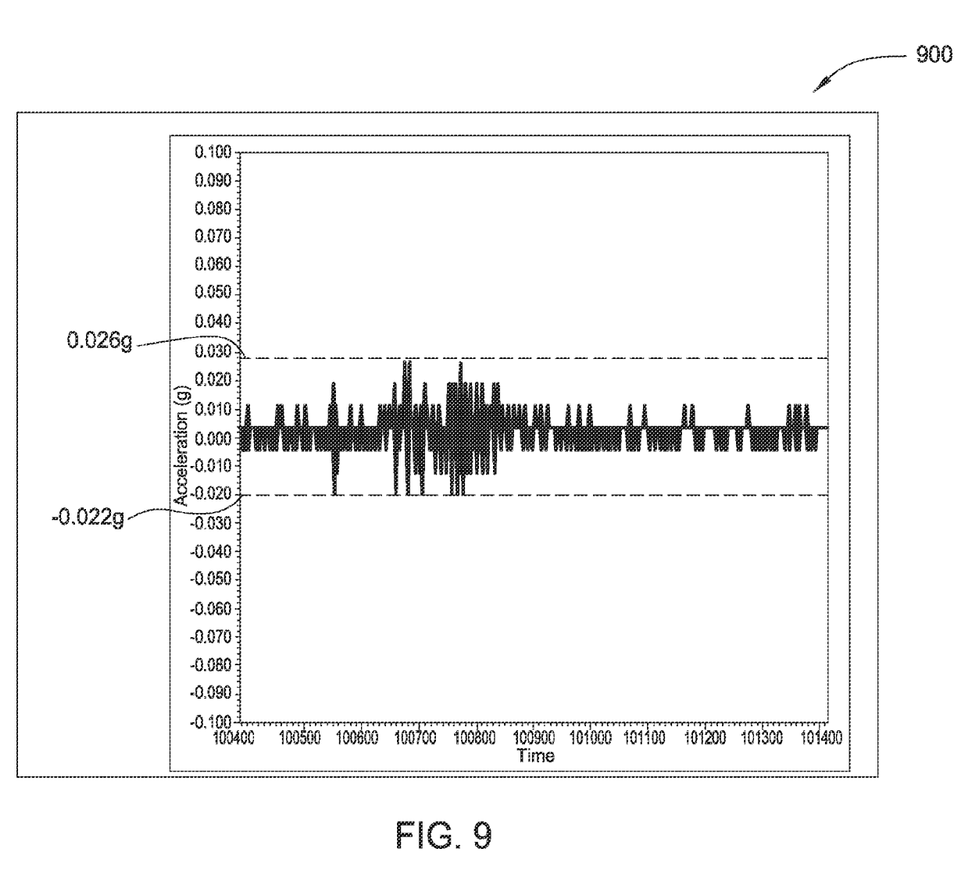

FIGS. 8 and 9 are graphs showing force values over time during operation of the slit valve assembly 106, and in particular, force values over time during operation of the plate actuator 238 when moving the first plate 224 and the second plate 226 laterally. FIG. 8 is a graph 800 showing a door sealing operation (closing) and FIG. 9 is a graph 900 showing a door unsealing (opening) operation. As shown, the force value of the door sealing operation is about 0.04 g's, and the force value for the unsealing operation is even less (0.02 g's).

In contrast, conventional slit valve assembly systems have been tested and produce a force of about 0.1 g's, or greater. Thus, a 60% reduction in shock is realized using the embodiments of the slit valve assembly 106 as described herein.

Thus, by utilizing the bumper assembly 212 alone, or in combination with, the flow control circuit 120 as described herein, shocks or jolts during operation of the slit valve assembly 106 are advantageously reduced. Thus, risk of contamination from particles shaken free during processing is reduced while advantageously maintaining fast opening and closing of the slit valve door 112. Additionally, embodiments disclosed herein advantageously permits improved operating times of the slit valve door without mitigating reliability of the mechanical components of the slit valve assembly 106. Further, the slit valve assembly 106 advantageously utilizes a single set of valves to control the speed of a vertical air cylinder in both upwards and downwards directions.

While the foregoing is directed to embodiments of the present disclosure, other and further embodiments may be devised without departing from the basic scope thereof, and the scope thereof is determined by the claims that follow.

The invention claimed is:

1. A slit valve assembly, comprising:
   a housing having side walls and at least one substrate transfer port formed therein, the housing having an interior volume defined by the side walls;
   a slit valve door disposed within the housing and positionable between an open position clear of the at least one substrate transfer port and a closed position sealing the at least one substrate transfer port; and
   a bumper assembly disposed on an edge of at least one face of the slit valve door, the bumper assembly comprising a plurality of first bumper members made of a first material and a plurality of second bumper members made of a second material that is different than the first material, wherein the plurality of first bumper members alternate with the plurality of second bumper members along parallel sides of the at least one face of the slit valve door.

2. The slit valve assembly of claim 1, wherein each of the plurality of first bumper members project from the at least one face to a first distance and each of the plurality of second bumper members project from the at least one face to a second distance, the second distance being greater than the first distance.

3. The slit valve assembly of claim 1, wherein each of the plurality of first bumper members project orthogonally from the at least one face to a first plane and each of the plurality of second bumper members project orthogonally from the at least one face to a second plane, the first plane being different than the second plane.

4. The slit valve assembly of claim 1, wherein the bumper assembly comprises a plurality of first bumper members and a plurality of second bumper members, and at least one of each of the plurality of first bumper members or at least one of the plurality of second bumper members comprise a conductive material.

5. The slit valve assembly of claim 1, wherein the first material includes a first hardness and the second material includes a second hardness, wherein the first hardness is greater than the second hardness.

6. The slit valve assembly of claim 5, wherein the bumper assembly comprises a plurality of first bumper members and a plurality of second bumper members, and each of the plurality of first bumper members alternate with each of the plurality of second bumper members along parallel sides of the at least one face.

7. A slit valve assembly, comprising:
   a housing having side walls and at least one substrate transfer port formed therein, the housing having an interior volume defined by the side walls;
   a slit valve door disposed within the housing and positionable between an open position clear of the substrate transfer port and a closed position sealing the at least one substrate transfer port;
   an actuator coupled to the slit valve door and operable to move the slit valve door between the open and closed positions; and
   a bumper assembly disposed on parallel edges of at least one face of the slit valve door, the bumper assembly comprising a plurality of first bumper members made of a first material and a plurality of second bumper members aligned with the first bumper members along a length of the parallel edges and made of a second material that is different than the first material, wherein each of the plurality of first bumper members project from the at least one face to a first distance and the plurality of second bumper members project from the at least one face to a second distance, the second distance being greater than the first distance.

8. A slit valve assembly, comprising:
   a housing having side walls and at least one substrate transfer port formed therein, the housing having an interior volume defined by the side walls;
   a slit valve door disposed within the housing and positionable between an open position clear of the substrate transfer port and a closed position sealing the at least one substrate transfer port;
   an actuator coupled to the slit valve door and operable to move the slit valve door between the open and closed positions; and
   a bumper assembly disposed on parallel edges of at least one face of the slit valve door, the bumper assembly comprising a plurality of first bumper members made of a first material and a plurality of second bumper members aligned with the first bumper members along a length of the parallel edges and made of a second material that is different than the first material, wherein each of the plurality of first bumper members alternate with each of the plurality of second bumper members.

9. The slit valve assembly of claim 8, wherein at least one of each of the plurality of first bumper members or at least one of each of the plurality of second bumper members comprise a conductive material.

10. A slit valve assembly, comprising:
    a housing having side walls and at least one substrate transfer port formed therein, the housing having an interior volume defined by the side walls;

a slit valve door disposed within the housing and positionable between an open position clear of the at least one substrate transfer port and a closed position sealing the at least one substrate transfer port; and a plurality of first bumper members and a plurality of second bumper members disposed on an edge of at least one face of the slit valve door, one of the plurality of first bumper members and one of the plurality of second bumper members being aligned along a length of the slit valve door, wherein each of the plurality of first bumper members project from the at least one face to a first distance and each of the plurality of second bumper members project from the at least one face to a second distance, the second distance being greater than the first distance.

11. A slit valve assembly, comprising:

a housing having side walls and at least one substrate transfer port formed therein, the housing having an interior volume defined by the side walls;

a slit valve door disposed within the housing and positionable between an open position clear of the at least one substrate transfer port and a closed position sealing the at least one substrate transfer port; and a plurality of first bumper members and a plurality of second bumper members disposed on an edge of at least one face of the slit valve door, one of the plurality of first bumper members and one of the plurality of second bumper members being aligned along a length of the slit valve door, wherein each of the plurality of first bumper members alternate with each of the plurality of second bumper members along parallel sides of the face.

12. A slit valve assembly, comprising:

a housing having side walls and at least one substrate transfer port formed therein, the housing having an interior volume defined by the side walls;

a slit valve door disposed within the housing and positionable between an open position clear of the at least one substrate transfer port and a closed position sealing the at least one substrate transfer port; and a plurality of first bumper members and a plurality of second bumper members disposed on an edge of at least one face of the slit valve door, one of the plurality of first bumper members and one of the plurality of second bumper members being aligned along a length of the slit valve door, wherein each of the plurality of first bumper members comprise a material having a first hardness and each of the plurality of second bumper members comprise a material having a second hardness, wherein the first hardness is greater than the second hardness.

13. The slit valve assembly of claim 12, wherein each of the plurality of first bumper members comprise a conductive material.

* * * * *